US009859911B1

(12) United States Patent
Chen et al.

(10) Patent No.: US 9,859,911 B1
(45) Date of Patent: Jan. 2, 2018

(54) SUCCESSIVE APPROXIMATION REGISTER ANALOG-TO-DIGITAL CONVERTER AND ANALOG-TO-DIGITAL SIGNAL CONVERSION METHOD THEREOF

(71) Applicant: REALTEK SEMICONDUCTOR CORPORATION, Hsinchu (TW)

(72) Inventors: Chih-Lung Chen, Hsinchu County (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/618,005

(22) Filed: Jun. 8, 2017

(30) Foreign Application Priority Data

Jun. 13, 2016 (TW) .............................. 105118465 A

(51) Int. Cl.
*H03M 1/12* (2006.01)
*H03M 1/38* (2006.01)
*H03M 1/06* (2006.01)
*H03M 1/34* (2006.01)

(52) U.S. Cl.
CPC ........... *H03M 1/38* (2013.01); *H03M 1/0697* (2013.01); *H03M 1/1245* (2013.01); *H03M 1/34* (2013.01)

(58) Field of Classification Search
CPC ........ H03M 1/002; H03M 5/08; H03M 1/007; H03M 1/1028; H03M 1/12; H03M 1/46; H03M 1/462; H03M 1/56; H03M 3/30; H03M 13/09; H03M 13/1515; H03M 13/256; H03M 13/2707; H03M 13/2915; H03M 13/39

USPC ......................... 341/118, 120, 155, 161, 172
See application file for complete search history.

(56) References Cited

U.S. PATENT DOCUMENTS

| 5,229,770 A | * | 7/1993 | Nakajima | ............. | H03M 1/462 341/161 |
| 6,075,478 A | * | 6/2000 | Abe | ...................... | H03M 1/002 341/155 |
| 6,094,154 A | * | 7/2000 | Lee | ....................... | H03M 1/462 341/155 |

(Continued)

OTHER PUBLICATIONS

Liu et al., A 12-bit 45-MS/s, 3-mW Redundant Successive-Approximation-Register Analog-to-Digital Converter With Digital Calibration, IEEE Journal of Solid-State Circuits, Nov. 2011, pp. 2661-2672, vol. 46 No. 11.

(Continued)

*Primary Examiner* — Linh Nguyen
(74) *Attorney, Agent, or Firm* — WPAT, P.C., Intellectual Property Attorneys; Anthony King

(57) ABSTRACT

A successive approximation register (SAR) analog-to-digital converter (ADC) comprises a comparator for generating a comparison value according to an analog signal; a SAR, coupled to the comparator, comprises N memory units, each memory unit storing a control value and the N control values being related to the comparison value, N being an integer greater than two; and a thermometer-coded DAC, which generates the analog signal and is coupled to the comparator and the SAR. The thermometer-coded DAC comprises N capacitors. The N capacitors are respectively coupled to the N memory units. The N terminal voltages of the N capacitors are respectively controlled by the N control values.

14 Claims, 9 Drawing Sheets

(56) References Cited

U.S. PATENT DOCUMENTS

| | | | |
|---|---|---|---|
| 6,809,674 B1* | 10/2004 | Ramsden | H03M 1/1225 |
| | | | 341/141 |
| 6,879,277 B1 | 4/2005 | Cai | |
| 8,115,664 B2* | 2/2012 | Kamikisaki | H03M 1/46 |
| | | | 341/155 |
| 8,508,400 B2 | 8/2013 | Wu et al. | |
| 8,633,844 B2* | 1/2014 | Piasecki | H03M 1/468 |
| | | | 341/155 |
| 2009/0040089 A1* | 2/2009 | Dosho | H03M 1/1215 |
| | | | 341/161 |
| 2012/0112938 A1* | 5/2012 | Haneda | H03M 1/12 |
| | | | 341/110 |

OTHER PUBLICATIONS

Wang et al., A 0.022 mm2 98.5 dB SNDR Hybrid Audio Delta Sigma Modulator With Digital ELD Compensation in 28 nm CMOS, IEEE Journal of Solid-State Circuits, Nov. 2015, pp. 1-10, vol. 50 No. 11.

Shu et al., An oversampling SAR ADC with DAC mismatch error shaping achieving 105dB SFDR and 101dB SNDR over 1kHz BW in 55nm CMOS, International Solid-State Circuits Conference, Feb. 3, 2016, pp. 458-460.

Chio et al., Design and Experimental Verification of a Power Effective Flash-SAR Subranging ADC, IEEE Transactions on Circuits and Systems—II: Express Briefs, Aug. 2010, pp. 607-611.

\* cited by examiner

SUCCESSIVE APPROXIMATION REGISTER ANALOG-TO-DIGITAL CONVERTER AND ANALOG-TO-DIGITAL SIGNAL CONVERSION METHOD THEREOF

BACKGROUND OF THE INVENTION

1. Field of the Invention

The present invention relates to an analog-to-digital converter (ADC), especially to a successive approximation register (SAR) ADC and an analog-to-digital signal conversion method thereof.

2. Description of Related Art

FIG. 1 shows a functional block diagram of a conventional SAR ADC. A SAR ADC converts an analog input signal Vi to a digital signal, which includes multiple digital codes B. The SAR ADC primarily includes a digital-to-analog converter (DAC) 110, a comparator 120, and a SAR 130. In one operation of the SAR ADC, the SAR 130 determines a value (I/O) of one bit of a digital code B according to a comparison value outputted by the comparator 120. The DAC 110 determines a terminal voltage of one of its multiple capacitors (e.g., controlling one terminal of the capacitor to be coupled to a reference voltage Vref or ground) according to the determined bit value, such that the charges on the capacitors redistribute to cause changes in the voltage levels at an inverting input and a non-inverting input of the comparator 120, which in turn causes changes in the voltages to be compared in the next operation. The foregoing steps are repeated, so the value represented by the digital code B gradually approximates the input signal Vi as the bit values of the digital code B are sequentially determined from the most significant bit (MSB) to the least significant bit (LSB).

Generally speaking, a switching mechanism applied to the capacitors of the DAC 110 is usually implemented in a binary method. Non-ideal capacitance values of the DAC 110, however, cause an error rate of the SAR ADC to increase, which in turn increases the integral nonlinearity (INL) and the differential nonlinearity (DNL) of the SAR ADC. The performance of the SAR ADC is severely affected especially when the capacitance value(s) of the capacitor(s) corresponding to higher bit(s) is(are) inaccurate. A thermometer-coded DAC is helpful to mitigate the bad influences caused by inaccurate capacitance values. FIG. 2 shows a schematic diagram of a conventional SAR ADC that makes use of a thermometer-coded DAC. The SAR ADC in FIG. 2 is five-bit (B0~B4, B0 being LSB and B4 being MSB). The DAC 110 includes five capacitors $C_1$~$C_5$. The capacitors $C_1$~$C_2$ belong to a binary DAC 111, while the capacitors $C_3$~$C_5$ belong to a thermometer-coded DAC 112. The capacitors $C_1$~$C_5$ are connected, through one of their respective terminals, to be an output of the DAC 110 that outputs an analog signal SA. The other terminals of capacitors $C_1$~$C_5$ are respectively connected to buffers 113-1~113-5, and the buffers 113-1~113-5 output the voltages to which the capacitors $C_1$~$C_5$ should be respectively coupled. The SAR 130 includes four registers 135-1~135-4, each storing one control value. The four control values of the four registers 135-1~135-4 are determined according to the comparison values of the comparator 120. The control values stored in the four registers 135 control the output voltages of the buffers 113. When the thermometer-coded DAC 112 is incorporated in the DAC 110, the DAC 110 must include a binary-to-thermometer decoder 114 that converts the control values of the registers 135-3 and 135-4 (i.e., the highest two bit values) from a binary code to a thermometer code to control the buffers 113-3~113-5. The switch 140 is utilized to sample the input signal Vi.

In the SAR ADC, the comparison operation of the comparator 120 and the switching operation of the DAC 110 are alternately performed in a high-speedy manner. The sooner the terminals of the capacitors of the DAC 110 that are coupled to the buffers 113 reach the target voltages in a switching operation, the more accurate the comparison value outputted by the comparator 120 in the following comparison operation will be. Therefore, the paths from the output of the comparator 120 to the terminals of the capacitors $C_1$~$C_5$ (including the registers 135 and the buffers 113) are quite critical for the SAR ADC. When there are fewer elements on these paths, the SAR ADC is more stable and more accurate because signals encounter less time delay on these paths. Unfortunately, the binary-to-thermometer decoder 114 typically includes multiple logic gates, which evidently increase the number of elements on these paths and thus degrade the performance of the SAR ADC.

The paper "An oversampling SAR ADC with DAC mismatch error shaping achieving 105 dB SFDR and 101 dB SNDR over 1 kHz BW in 55 nm CMOS" (ISSCC, pages 458-459, IEEE, (2016)) discloses a SAR ADC that includes an additional flash ADC to directly generate thermometer codes. This approach, however, causes the circuit complexity and power consumption of the SAR ADC to increase. The U.S. Pat. No. 8,508,400 can only make improvements to specific digital values of the SAR ADC because the proposed approach is limited to the ways the capacitors are grouped. In addition, the proposed approach adds multiplexers on the critical paths, causing extra signal delays.

SUMMARY OF THE INVENTION

In view of the issues of the prior art, an object of this invention is to provide a successive approximation register (SAR) analog-to-digital converter (ADC) and an analog-to-digital signal conversion method thereof to improve the performance of the SAR ADC.

A SAR ADC is disclosed. The SAR ADC comprises a DAC, a SAR, a write control unit and a comparator. The DAC comprises N capacitors whose capacitance values are substantially the same and generates an analog signal. N is an integer greater than two. The SAR comprises N memory units. The N memory units are respectively coupled to the N capacitors. Each memory unit stores a control value, and N terminal voltages of the N capacitors are respectively controlled by the N control values. The write control unit, coupled to the N memory units, generates a write-enable signal. M memory units of the N memory units and M capacitors corresponding to the M memory units are selected according to the write-enable signal. M is a positive integer smaller than N. The comparator, coupled to the DAC and the N memory units, generates a comparison value according to the analog signal. The M control values of the M memory units change in correspondence to the comparison value.

A SAR ADC is disclosed. The SAR ADC comprises a comparator, a SAR, a thermometer-coded DAC, and a write control unit. The comparator generates a comparison value according to an analog signal. The SAR, coupled to the comparator, comprises N memory units. Each memory unit stores a control value. The N control values are associated with the comparison value. N is an integer greater than two. The thermometer-coded DAC, coupled to the comparator and the SAR, generates the analog signal and comprises N capacitors. The N capacitors are respectively coupled to the N memory units, and N terminal voltages of the N capacitors are respectively controlled by the N control values. The write control unit, coupled to the N memory units, generates a write-enable signal. M of the N memory units and M capacitors corresponding to said M memory units are selected according to the write-enable signal, and M is a positive integer smaller than N.

A method for converting an analog signal to a digital signal is also disclosed. The method is applied to a SAR ADC. The SAR ADC operates according to a clock and comprises a DAC and a SAR. The DAC comprises N capacitors whose capacitance values are substantially the same. N is an integer greater than two. The SAR comprises N memory units. The N memory units are respectively coupled to the N capacitors. Each memory unit stores a control value. N terminal voltages of the N capacitors are respectively controlled by the N control values. The method comprises: sampling an analog input signal to generate an intermediate analog signal at a first level of a cycle of the clock; determining a write-enable signal in the cycle; selecting M of the N memory units and M capacitors corresponding to the M memory units according to the write-enable signal, M being a positive integer smaller than N; generating a comparison value according to the intermediate analog signal at a second level of the cycle, the second level being different from the first level; and changing the M control values of the M memory units according to the comparison value at the second level of the cycle.

The SAR ADC and the analog-to-digital signal conversion method of the present invention do not use a binary-to-thermometer decoder, thus preventing the increase of signal delays on the critical paths. Compared to the prior art, the SAR ADC of the present invention solves the issues caused by inaccurate capacitance values without sacrificing the operating speed.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
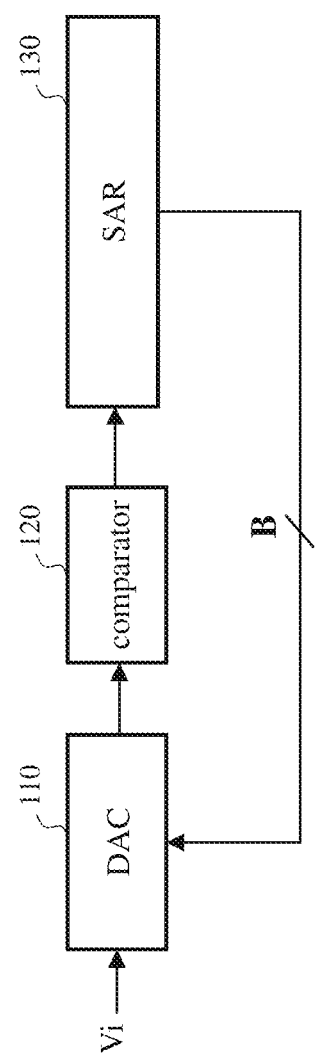
FIG. 1 shows a functional block diagram of a conventional successive approximation register (SAR) analog-to-digital converter (ADC).
Figure 2:
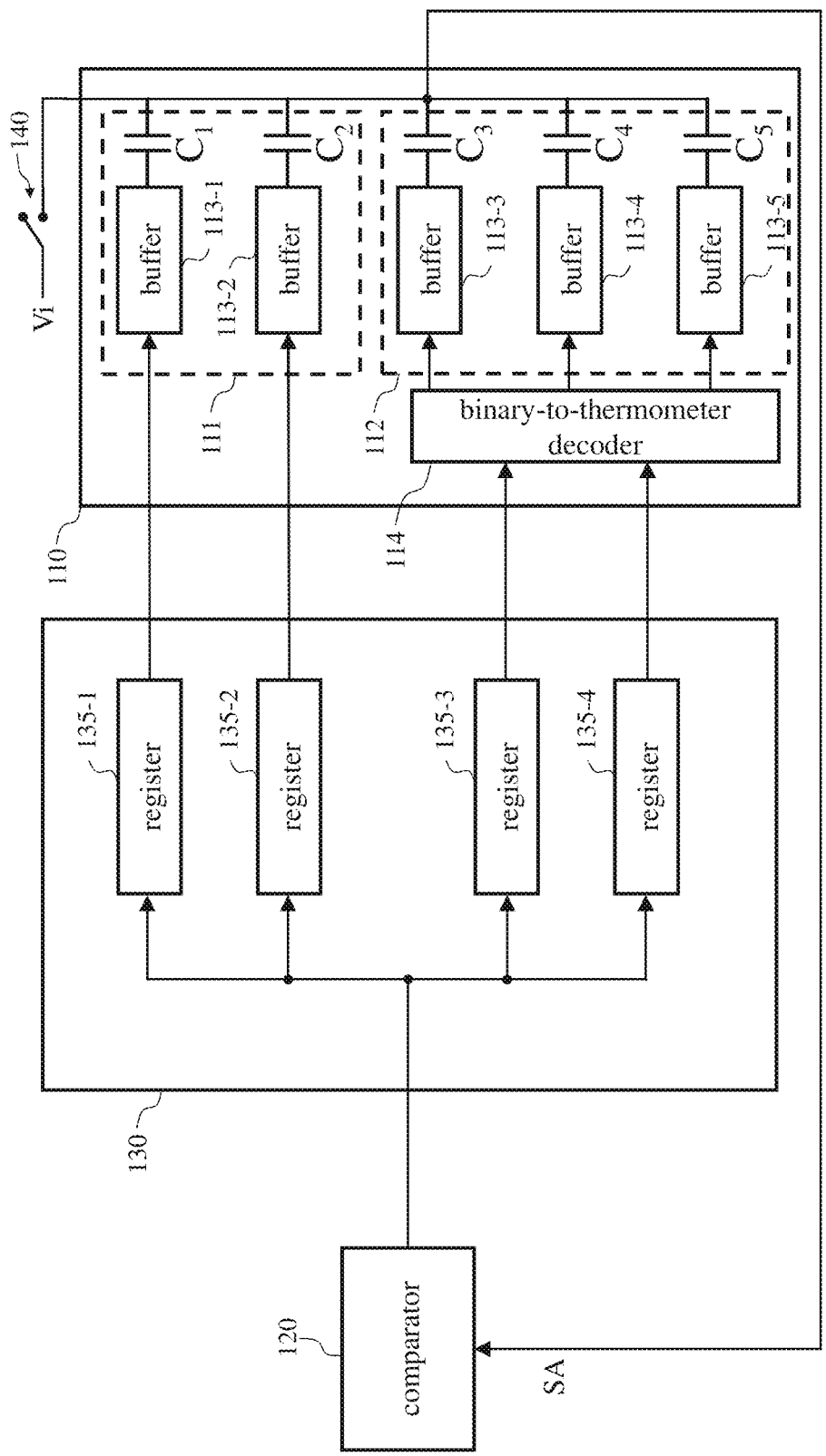
FIG. 2 shows a schematic diagram of a conventional SAR ADC that makes use of a thermometer-coded DAC.
Figure 3:
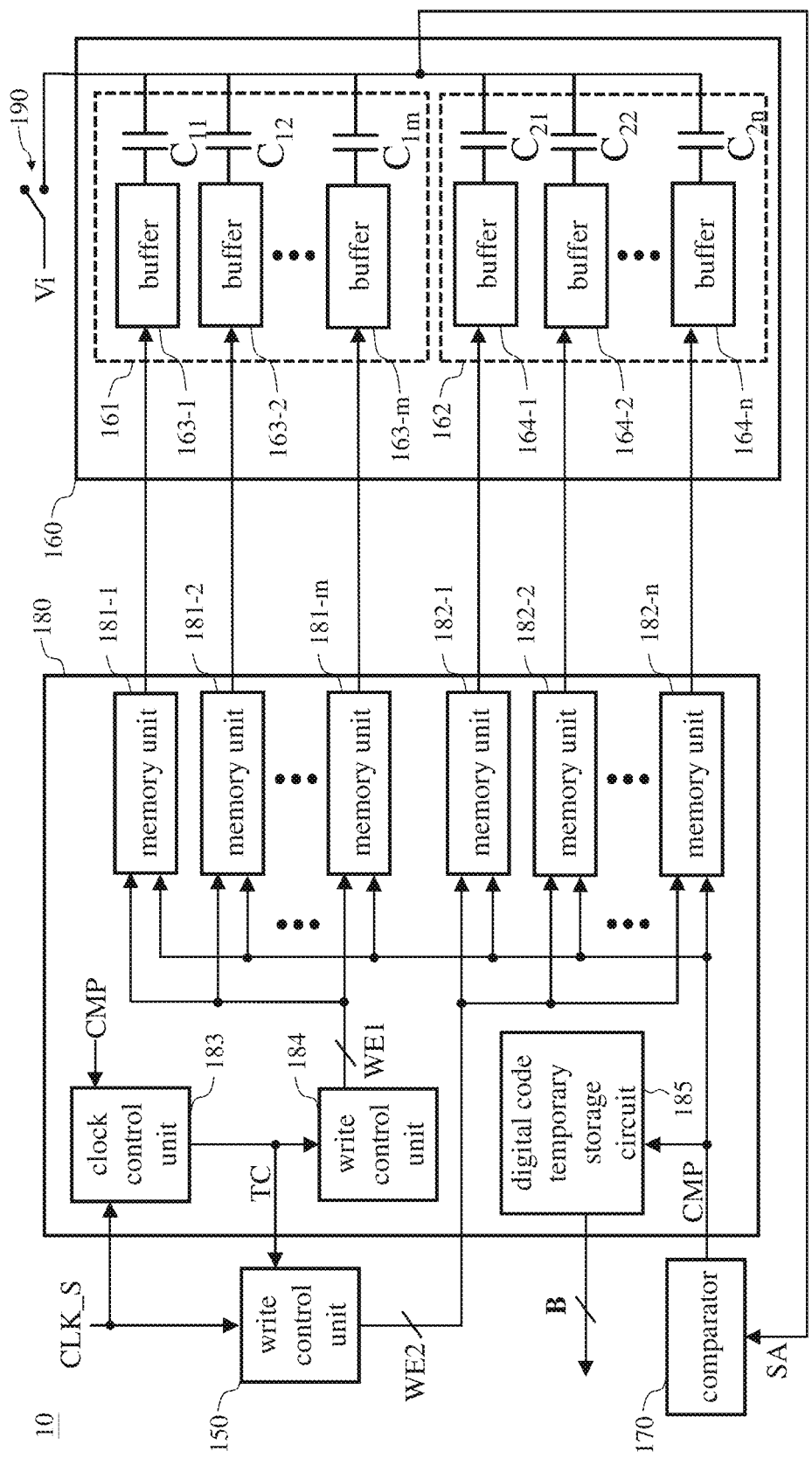
FIG. 3 shows a functional block diagram of a SAR ADC according to an embodiment of the present invention.

FIG. 3 shows a functional block diagram of a successive approximation register (SAR) analog-to-digital converter (ADC) according to an embodiment of the present invention. The SAR ADC 10 includes a write control unit 150, a digital-to-analog converter (DAC) 160, a comparator 170, a SAR 180 and a switch 190. The DAC 160 includes a binary DAC 161 and a thermometer-coded DAC 162. The binary DAC 161 includes m capacitors ($C_{11}$~$C_{1m}$), each having one of its two terminals coupled to one of the buffers 163-1~163-$m$. The thermometer-coded DAC 162 includes n capacitors ($C_{21}$~$C_{2n}$), and each having one of its two terminals coupled to one of the buffers 164-1~164-$n$. n is an integer greater than two, and m is a positive integer. In one embodiment, n=$2^r$−1, and r is an integer greater than one. The capacitance values of the capacitors $C_{11}$~$C_{1m}$ are 1C, 2C, ..., $2^{m-2}$C, and $2^{m-1}$C, respectively, and the capacitance values of the capacitors $C_{21}$~$C_{2n}$ are substantially the same, which is $2^m$C. C is a unit capacitance value. More specifically, the capacitance value of any capacitor of the thermometer-coded DAC 162 is twice the capacitance value of the largest capacitor of the binary DAC 161.

The SAR 180 includes a plurality of memory units 181 and a plurality of memory units 182. Each memory unit 181-$x$ corresponds to a buffer 163-$x$ and a capacitor $C_{1x}$ (1≤x≤m) that are connected, and each memory unit 182-$y$ corresponds to a buffer 164-$y$ and a capacitor $C_{2y}$ (1≤y≤n) that are connected. More specifically, the memory units 181-1~181-$m$ and the capacitors $C_{11}$~$C_{1m}$ are in one-to-one correspondence, and the memory units 182-1~182-$n$ and the capacitors $C_{21}$~$C_{2n}$ are in one-to-one correspondence. Each of the memory units 181 and 182 stores a control value. The output voltages of the buffers 163 and 164 are associated with the control values; that is to say, a voltage of a first terminal of each of the capacitors $C_{11}$~$C_{1m}$ and the capacitors $C_{21}$~$C_{2n}$ (the terminal coupled to the buffer 163 or 164) is controlled by the control value. Each of the memory units 181 and 182 is coupled to the comparator 170, and the control values of the memory units 181 and 182 are associated with the comparison value CMP. The SAR 180 further includes a write control unit 184 that determines whether each memory unit 181 can be written. Whether each memory unit 182 can be written is controlled by the write control unit 150. The SAR 180 further includes a clock control unit 183 that generates a pulse signal TC according to the sampling clock CLK_S of the SAR ADC and the comparison value CMP of the comparator 170. The write control unit 184 and the write control unit 150 respectively output the write-enable signals WE1 and the write-enable signals WE2 by referring to the pulse signal TC. The SAR 180 further includes a digital code temporary storage circuit 185 that determines the digital code B outputted by the SAR ADC according to the comparison values CMP of the comparator 170. The digital code temporary storage circuit 185 may include a plurality of flip-flops.

Figure 4:
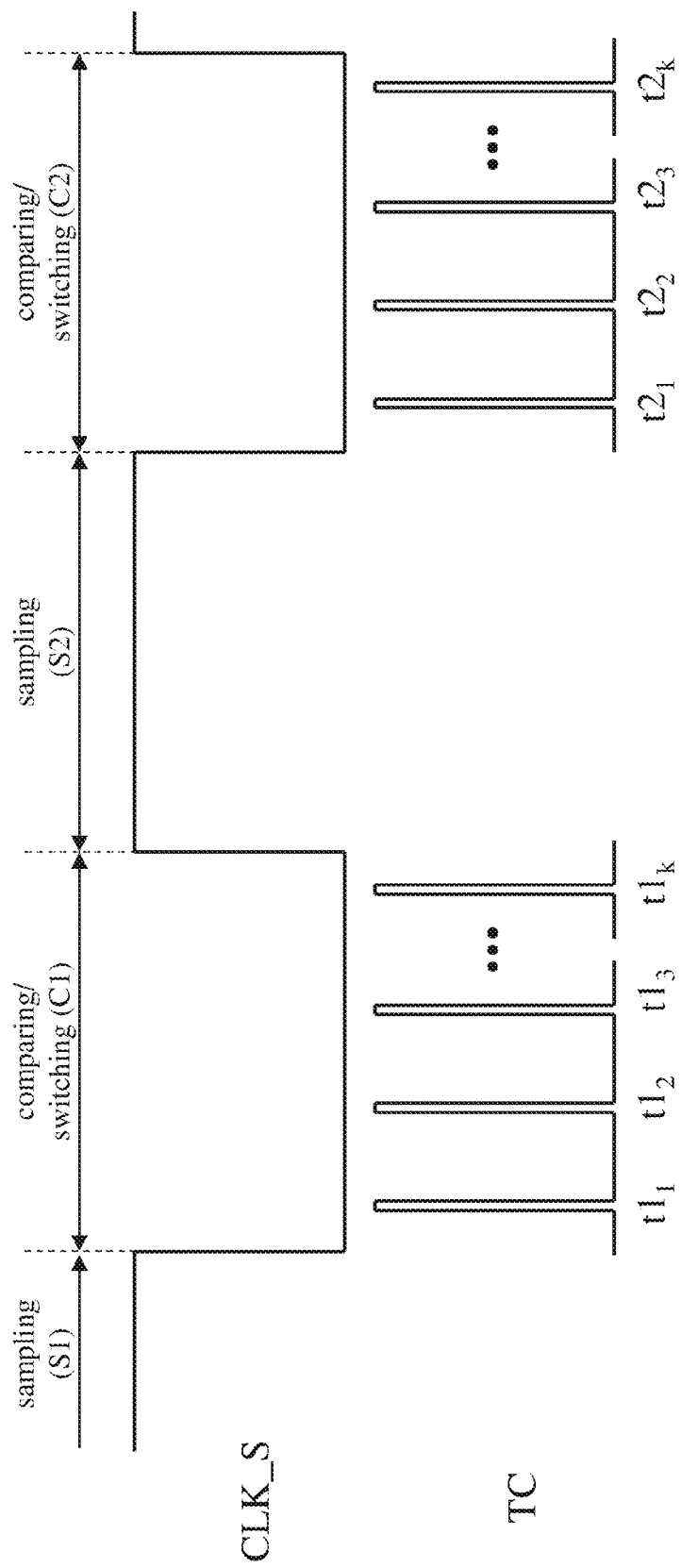
FIG. 4 shows the timing diagrams of the SAR ADC of the present invention.

The operation of the SAR ADC in FIG. 3 is detailed below with reference to the timing diagrams shown in FIG. 4. The upper diagram in FIG. 4 shows the sampling clock CLK_S of the SAR ADC, which controls the SAR ADC to alternately operate in the sampling phases (S1, S2, . . . ) and the comparing/switching phases (C1, C2, . . . ). In the sampling phases (corresponding to high levels of the sampling clock CLK_S in this embodiment), the first terminals of the capacitors $C_{11}$~$C_{1m}$ and $C_{21}$~$C_{2n}$ are coupled to a predetermined voltage level. More specifically, in the sampling phases the SAR 180 resets the memory units 181 and 182 by resetting the control values stored therein to default values. After the memory units 181 and 182 are reset (still in the sampling phase), the switch 190 is conducted and thus the second terminals (the terminals not coupled to the buffer 163 or 164) of the capacitors $C_{11}$~$C_{1m}$ and $C_{21}$~$C_{2n}$ and the input terminal of the comparator 170 receive the analog input signal Vi. In the same sampling phase, the write control unit 150 determines a plurality of write-enable signals WE2. The number of the write-enable signals WE2 is $G=\log_2(n+1)$.

In the comparing/switching phases (corresponding to low levels of the sampling clock CLK_S in this embodiment), the switch 190 is first switched to a non-conducted state, and the write control unit 150 outputs the write-enable signals WE2. Next, the comparator 170 and the DAC 160 respectively perform the comparison operation and the operation of switching the voltage levels of the capacitors. The comparator 170 may operate according to an internal self-generated clock or according to an external clock whose frequency is higher than that of the sampling clock CLK_S. When the sampling clock CLK_S is at low levels, the clock control unit 183 outputs a pulse each time the comparator 170 generates a comparison value CMP. For example, when the SAR ADC 10 is k-bit, the comparator 170 generates k comparison values CMP in one comparing/switching phase and thus the pulse signal TC has k pulses at time $t1_1$~$t1_k$, respectively. The time interval between any two successive pulses (i.e., $t1_2$-$t1_1$, $t1_3$-$t1_2$, . . . , $t1_k$-$t1_{k-1}$) is the time when the memory units 181 and 182 selectively change the control values according to the comparison values CMP and the buffers 163 and 164 selectively change the terminal voltages of the capacitors according to the control values. In other words, the time interval is the response time of the foregoing critical path. When a SAR ADC has a higher speed (i.e., the frequency of the sampling clock CLK_S is higher) and a higher resolution (i.e., k is greater), the response time of the critical path is shorter, and therefore the critical paths become more crucial to the performance of the SAR ADC. After the comparator 170 completes k times of comparison operations, the digital code temporary storage circuit 185 obtains k comparison values CMP. The combination of the k comparison values CMP is the digital code B (B0~Bk) of the analog input signal Vi sampled in a corresponding sampling phase.

The G write-enable signals WE2 determined in each sampling phase are outputted in sequence in the immediately-following comparing/switching phase. More specifically, the first write-enable signal WE2 is outputted before the comparator 170 generates the first comparison value CMP in the comparing/switching phase (i.e., outputted before time $t1_1$), the second write-enable signal WE2 is outputted after the comparator 170 generates the first comparison value CMP and before the comparator 170 generates the second comparison value CMP (i.e., outputted between time $t1_1$ and time $t1_2$.), and so forth. The write control unit 184 determines m write-enable signals WE1. The m write-enable signals WE1, which respectively enable the memory unit 181-m~181-1 in sequence, are outputted in sequence after the G write-enable signals WE2 are completely outputted.

Figure 5:
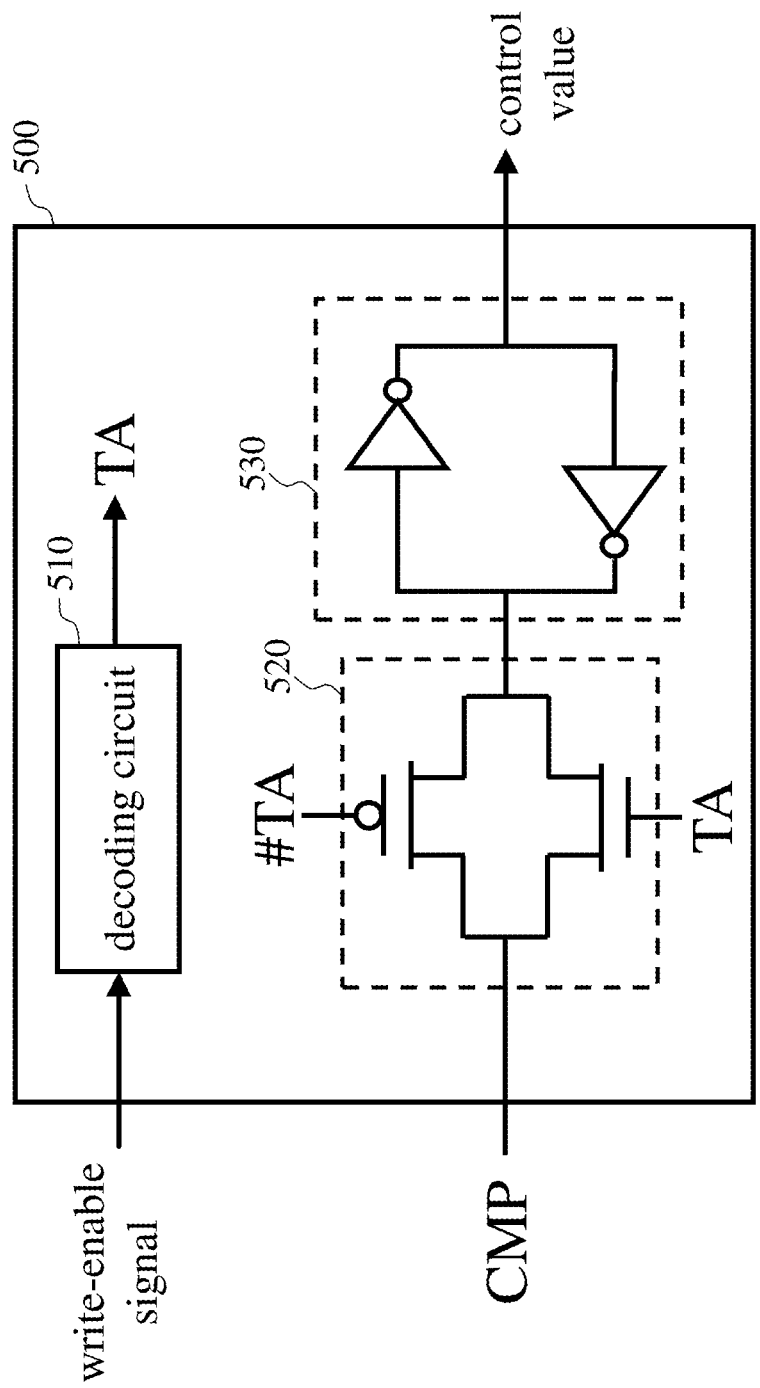
FIG. 5 shows a functional block diagram of the memory unit according to one embodiment of the present invention.

FIG. 5 shows a functional block diagram of the memory unit according to one embodiment of the present invention. Each of the memory units 181 and 182 can be implemented by the memory unit 500 shown in FIG. 5. The memory unit 500 includes a decoding circuit 510, a switch 520, and a latch 530. The write-enable signal (WE1 or WE2) is decoded by the decoding circuit 510 to generate a control signal TA that controls the switch 520 to be conducted or not conducted. The memory unit 500 becomes writable when the switch 520 is conducted and becomes not writable when the switch 520 is not conducted. When the switch 520 is conducted, the control value stored in the latch 530 may change according to the comparison value CMP. For example, for the embodiment shown in FIG. 5, the control value and the comparison value CMP have opposite logic values; in other embodiments, an additional inverter can be added to cause the control value and the comparison value CMP to have the same logic value.

Taking a 6-bit SAR ADC (i.e., k=6, and the outputted digital code B being B0~B5) as an example, the operation of the SAR ADC 10 is detailed below. Assuming that the binary DAC 161 includes two capacitors $C_{11}$ and $C_{12}$, whose capacitance values are 1C and 2C respectively, and the thermometer-coded DAC 162 includes seven capacitors $C_{21}$~$C_{27}$, whose capacitance values are all 4C. In the sampling phase S1, the write control unit 150 determines three ($G=\log_2(7+1)=3$) write-enable signals WE2-S1-1, WE2-S1-2, and WE2-S1-3. The write control unit 184 determines two write-enable signals WE1-S1-1 and WE1-S1-2 that correspond to the capacitors $C_{12}$ and $C_{11}$, respectively.

Figure 6:
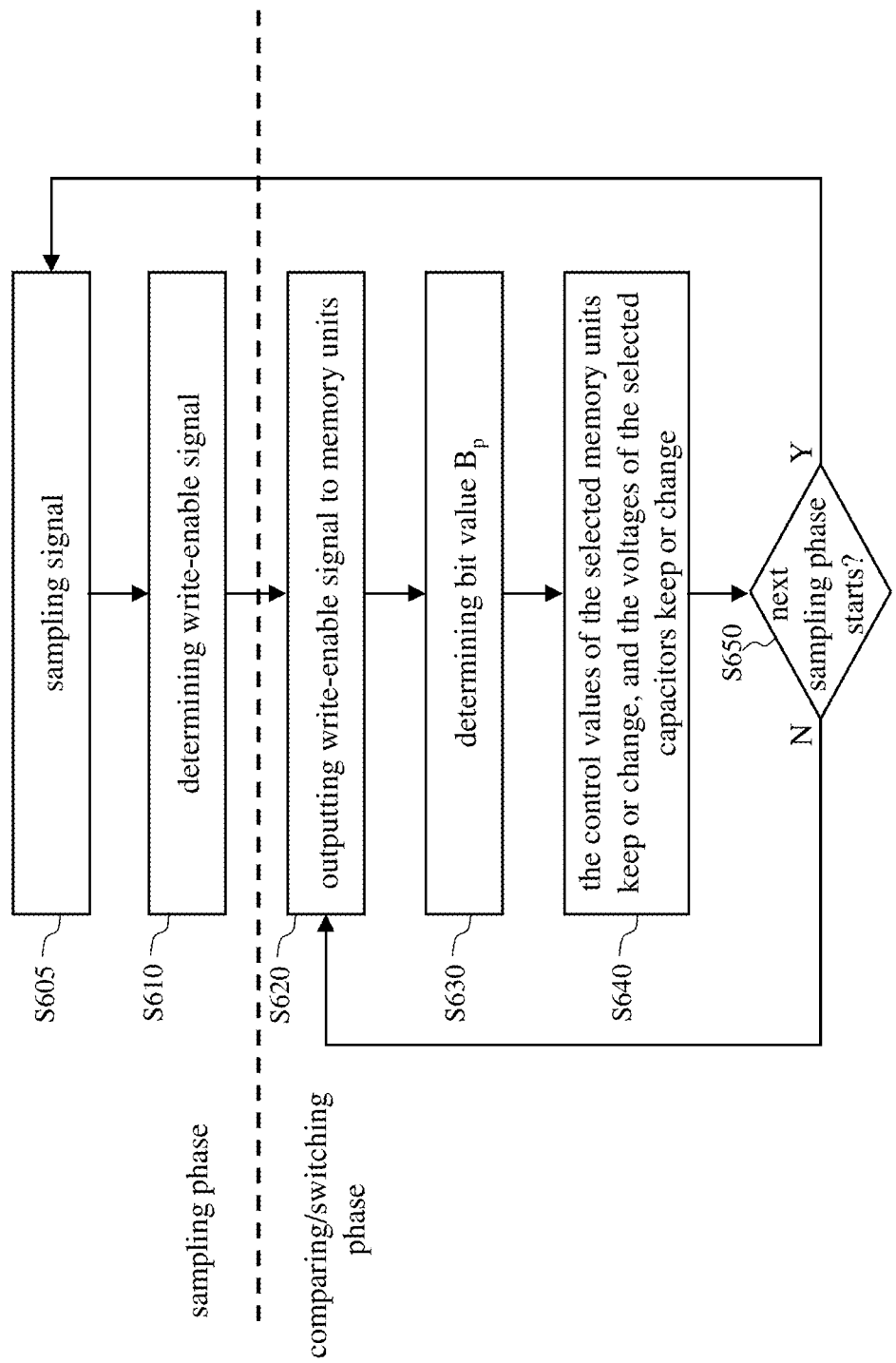
FIG. 6 shows a flowchart of the method for converting an analog signal to a digital signal according to an embodiment of this invention.

FIG. 6 shows a flowchart of the SAR ADC 10 converting an analog signal to a digital signal. In the sampling phase, the switch 190 is conducted to sample the analog input signal Vi (step S605), and the write control unit 150 determines the write-enable signals (step S610). In two successive sampling phases (e.g., the phases S1 and S2 shown in FIG. 4), the write control unit 150 generates different write-enable signals. For example, as shown in table 1, the three write-enable signals determined by the write control unit 150 in the sampling phase S1 respectively select the capacitors $C_{21}$, $C_{23}$, $C_{24}$, $C_{26}$ as a first capacitor group, the capacitors $C_{22}$, $C_{25}$ as a second capacitor group, and the capacitor $C_{27}$ as a third capacitor group; the three write-enable signals determined by the write control unit 150 in the sampling phase S2 respectively select the capacitors $C_{21}$, $C_{22}$, $C_{25}$, $C_{27}$ as the first capacitor group, the capacitors $C_{24}$, $C_{26}$ as the second capacitor group, and the capacitor $C_{23}$ as the third capacitor group.

TABLE 1

| Sampling phase | Write-enable signals | Corresponding capacitor group |
|---|---|---|
| S1 | WE2-S1-1 | $C_{21}$, $C_{23}$, $C_{24}$, $C_{26}$ |
|  | WE2-S1-2 | $C_{22}$, $C_{25}$ |
|  | WE2-S1-3 | $C_{27}$ |
|  | WE1-S1-1 | $C_{12}$ |
|  | WE1-S1-2 | $C_{11}$ |
| S2 | WE2-S2-1 | $C_{21}$, $C_{22}$, $C_{25}$, $C_{27}$ |
|  | WE2-S2-2 | $C_{24}$, $C_{26}$ |
|  | WE2-52-3 | $C_{23}$ |

TABLE 1-continued

| Sampling phase | Write-enable signals | Corresponding capacitor group |
|---|---|---|
| | WE1-S2-1 | $C_{12}$ |
| | WE1-S2-2 | $C_{11}$ |
| S3 | WE2-S3-1 | $C_{23}, C_{24}, C_{25}, C_{26}$ |
| | WE2-S3-2 | $C_{27}, C_{21}$ |
| | WE2-S3-3 | $C_{22}$ |
| | WE1-S3-1 | $C_{12}$ |
| | WE1-S3-2 | $C_{11}$ |

Next, the process in FIG. 6 enters the comparing/switching phase. Because the SAR ADC 10 is a 6-bit ADC in this example, the pulse signal TC has six pulses at time $t1_1$~$t1_6$. The six pulses correspond to B5~B0, respectively. Before each pulse is generated (i.e., before the comparator 170 generates the comparison value CMP to determine a bit value $B_p$ (0≤p≤5)) (step S630), the write control unit 150 outputs the write-enable signal to all of the memory units 182-1~182-7 (step S620). More specifically, before a $p^{th}$ comparing operation of the comparator 170 is completed, the capacitor(s) to be manipulated in the $p^{th}$ switching operation is(are) determined. As shown in table 2, the write-enable signal WE2-S1-1 is outputted to the memory units 182-1~182-7 before the bit value B5 is determined (i.e., before time $t1_1$) to correspondingly select the capacitors $C_{21}$, $C_{23}$, $C_{24}$, $C_{26}$, and the write-enable signal WE2-S1-2 is outputted to the memory units 182-1~182-7 after the bit value B5 is determined and before the bit value B4 is determined (i.e., between time $t1_1$ and time $t1_2$) to correspondingly select the capacitors $C_{22}$ and $C_{25}$, and so forth.

TABLE 2

| Write-enable signals | Output time point | Selected capacitor(s) |
|---|---|---|
| WE2-S1-1 | before $B_5$ is determined | $C_{21}, C_{23}, C_{24}, C_{26}$ |
| WE2-S1-2 | after $B_5$ is determined and before $B_4$ is determined | $C_{22}, C_{25}$ |
| WE2-S1-3 | after $B_4$ is determined and before $B_3$ is determined | $C_{27}$ |
| WE1-S1-1 | after $B_3$ is determined and before $B_2$ is determined | $C_{12}$ |
| WE1-S1-2 | after $B_2$ is determined and before $B_1$ is determined | $C_{11}$ |

After the bit value $B_p$ is determined (step S630 is complete), the control value(s) of the memory unit(s) 182 corresponding to the selected capacitor(s) keep(s) or change(s), depending on the bit value $B_p$, to correspondingly keep or change a terminal voltage of the selected capacitor (step S640). For example, assuming that a default value of the control value is logic 1 (correspondingly, a default voltage of the first terminal of the capacitor is a low voltage), and that the bit value B4 is determined to be logic 1 at time $t1_2$, in step S640 (corresponding to the time interval between $t1_2$ and $t1_3$) the control values of the memory units 182-5 and 182-6 change from logic 1 to logic 0, and the voltages of the first terminals of the capacitors $C_{25}$ and $C_{26}$ also change from low to high. Next, it is determined whether the next sampling phase starts (step S650). If not, steps S620~S640 are repeated to continue the determination of the remaining bit values. If the next sampling phase starts, the process goes back to step S605 to sample the analog input signal Vi again. It should be noted that, a few minor steps are omitted for brevity in FIG. 6. For example, the memory units 181 and 182 are reset in the sampling phase, and the switch 190 is not conducted in the comparing/switching phase.

As shown in table 1, the composition of the capacitor group (including $C_{21}, C_{23}, C_{24}, C_{26}$) corresponding to the bit value B5 in the first operating period of the SAR ADC (including the sampling phase S1 and the comparing/switching phase C1) is different from the composition of the capacitor group (including $C_{21}, C_{22}, C_{25}, C_{27}$) corresponding to the bit value B5 in the second operating period (including the sampling phase S2 and the comparing/switching phase C2). Likewise, the composition of the capacitor group (including $C_{22}, C_{25}$) corresponding to the bit value B4 in the first operating period of the SAR ADC is different from the composition of the capacitor group (including $C_{24}, C_{26}$) corresponding to the bit value B4 in the second operating period, and the composition of the capacitor group (including $C_{27}$) corresponding to the bit value B3 in the first operating period of the SAR ADC is different from the composition of the capacitor group (including $C_{23}$) corresponding to the bit value B3 in the second operating period. In addition, the compositions of the capacitor groups are decided before the corresponding bit values B5, B4, and B3 are generated. In other words, the compositions of the capacitor groups are not associated with bit values B5, B4, and B3 (i.e., not decided according to the bit values B5, B4, and B3). As a result, a binary-to-thermometer decoder is not required in the present invention, and therefore the performance of the SAR ADC 10 is not degraded since no additional logic circuits are added to the critical paths between the SAR 180 and the DAC 160. It should be noted that, the foregoing expression "the $q^{th}$ capacitor group corresponding to a bit value $B_p$" means that the terminal voltage(s) of the capacitor(s) of the $q^{th}$ capacitor group is(are) associated with the bit value $B_p$.

Figure 7:
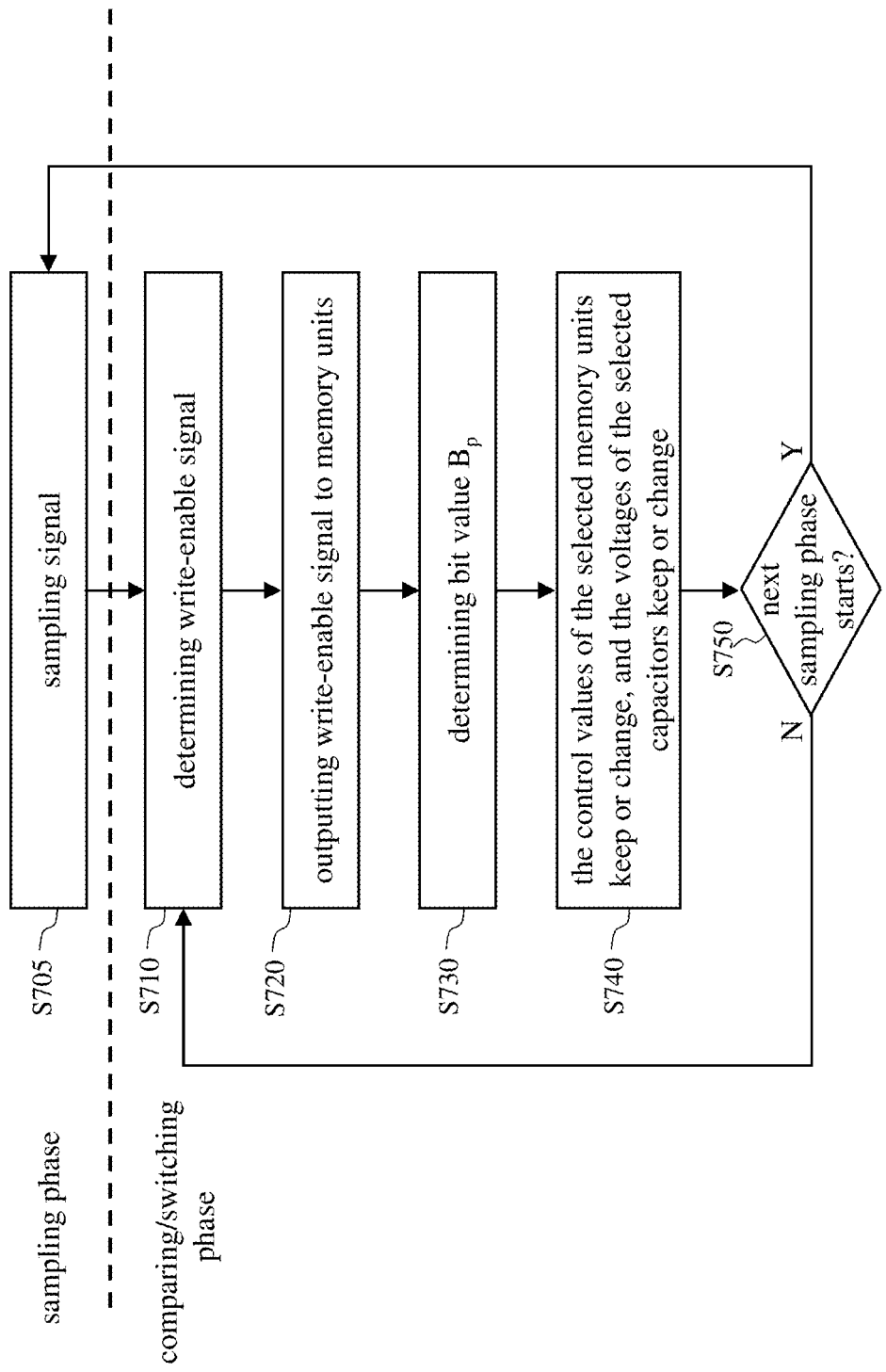
FIG. 7 shows a flowchart of the method for converting an analog signal to a digital signal according to another embodiment of this invention.

In other embodiments, the write control unit 150 may determine the write-enable signals in the comparing/switching phase. The write control unit 150 can determine the write-enable signals at any time before the write-enable signals are outputted. As shown in table 3, the write control unit 150 can determine the write-enable signal WE2-S1-1 at the transition from the sampling phase to the comparing/switching phase of the sampling clock CLK_S and output the write-enable signal WE2-S1-1 before time $t1_1$; subsequently, the write control unit 150 determines and outputs the corresponding write-enable signal between two successive pulses of the pulse signal TC. FIG. 7 shows the corresponding flowchart. Details of the actions of steps S705~S750 are the same as or similar to those of steps S605~S650, and shall be omitted herein.

TABLE 3

| Write-enable signal | Determination and output time point | Selected capacitor(s) |
|---|---|---|
| WE2-S1-1 | before $B_5$ is determined | $C_{21}, C_{23}, C_{24}, C_{26}$ |
| WE2-S1-2 | after $B_5$ is determined and before $B_4$ is determined | $C_{22}, C_{25}$ |
| WE2-S1-3 | after $B_4$ is determined and before $B_3$ is determined | $C_{27}$ |
| WE1-S1-1 | after $B_3$ is determined and before $B_2$ is determined | $C_{12}$ |
| WE1-S1-2 | after $B_2$ is determined and before $B_1$ is determined | $C_{11}$ |

Figure 8:
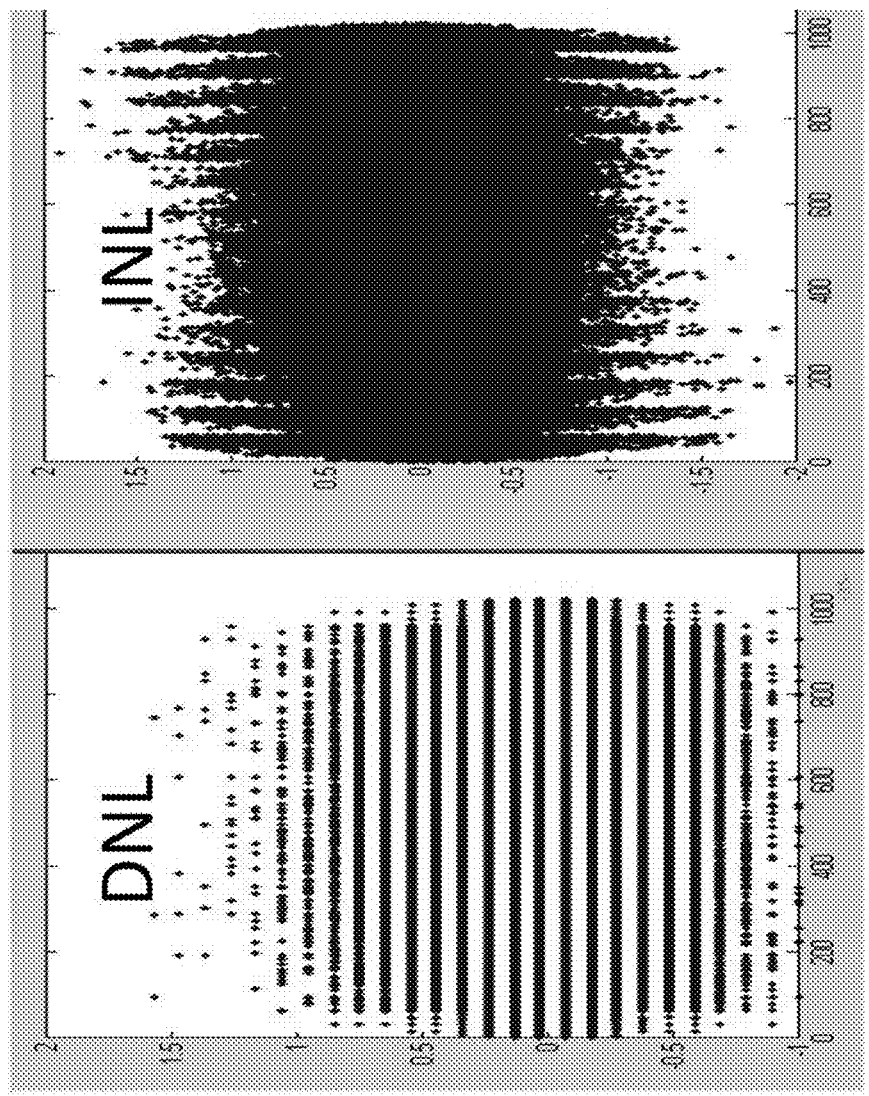
FIG. 8 shows the Monte Carlo simulation results of the mechanisms disclosed in this invention.
Figure 9:
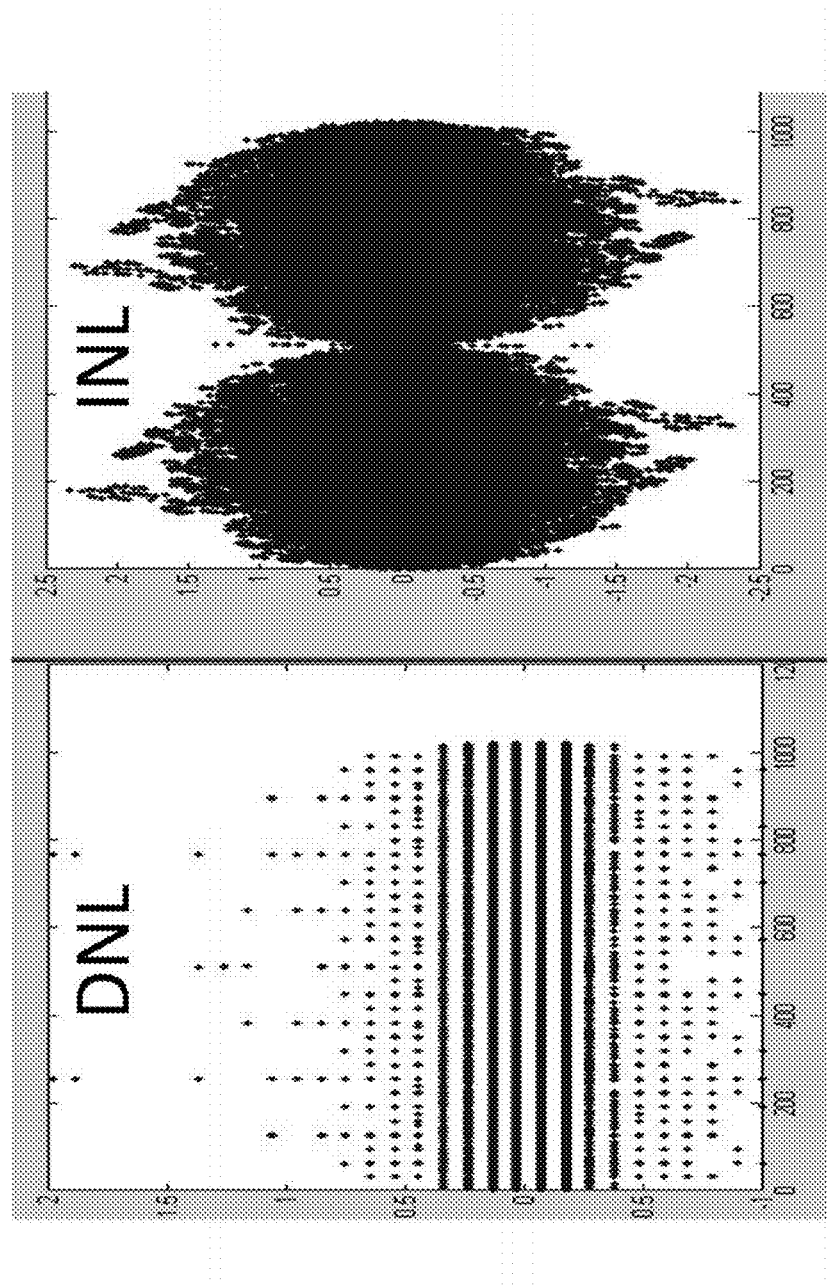
FIG. 9 shows the Monte Carlo simulation results of the mechanisms disclosed in the prior art.

FIGS. 8 and 9 show the Monte Carlo simulation results of the mechanisms disclosed in this invention and in U.S. Pat. No. 8,508,400, respectively. Evidently, limited by the way the capacitors are grouped, the mechanism of U.S. Pat. No.

8,508,400 has improvements in only the vicinity of the digital code equal to 512 (decimal). On the contrary, the mechanism disclosed in this invention achieves a more uniform improvement for the entire digital codes, and the magnitudes of both DNL and INL are also lower.

In another embodiment, the entire DAC 160 can be implemented by a thermometer-coded DAC; that is, the DAC 160 includes the thermometer-coded DAC 162 but does not include the binary DAC 161. In this way, the SAR 180 correspondingly includes the memory units 182 but does not include the memory units 181 and the write control unit 184. Further, although the foregoing embodiments are described by taking binary capacitors (i.e., the capacitance values thereof show a binary relationship) as an example, this invention may also use an arbitrary weighted capacitor array (AWCA) to implement and control the DAC. Hence, the capacitance values, the number of capacitors, and the number of comparing/switching operations mentioned above are for the purpose of explanation, not for limiting the scope of this invention. When the DAC of this invention is implemented by the AWCA, the capacitors of the DAC and the memory units of the SAR 180 are still in one-to-one correspondence.

It should be noted that, FIG. 3 depicts only the elements coupled to one terminal (either an inverting input or a non-inverting input) of the comparator 170. In the embodiment shown in FIG. 3, the write control unit 150 and the SAR 180 are stand-alone elements, but in another embodiment the write control unit 150 may be incorporated into the SAR 180. In additional to the foregoing random method, the write control unit 150 can also generate the write-enable signals in a rotation manner, or generate the write-enable signals according to a mechanism of dynamic element matching (DEM) or dynamic weighted average (DWA). The write control unit 150 can be implemented by logic gates, or a processing unit running software or firmware. The clock control unit 183 and the write control unit 184 can be implemented by logic gates. The buffers 163 and 164 can be implemented by inverters connected in series. Each of the capacitors $C_{11}$~$C_{1m}$ and $C_{21}$~$C_{2n}$ may include a plurality of unit capacitors, and during the operating process of the SAR ADC 10, the composition of each capacitor does not change. Although the aforementioned write-enable signals WE1 are determined in the sampling phase, they can be determined in other phases as well.

Since people of ordinary skill in the art can appreciate the implementation detail and the modification thereto of the present method invention of FIG. 6 and FIG. 7 through the disclosure of the device invention of FIG. 3, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A successive approximation register (SAR) analog-to-digital converter (ADC), comprising:
   a digital-to-analog converter (DAC), comprising N capacitors whose capacitance values are substantially the same, generating an analog signal, N being an integer greater than two;
   a SAR, comprising N memory units, wherein said N memory units are respectively coupled to said N capacitors, each said memory unit stores a control value, and N terminal voltages of said N capacitors are respectively controlled by said N control values;
   a write control unit, coupled to said N memory units, generating a write-enable signal, according to which M memory units of said N memory units and M capacitors corresponding to said M memory units are selected, wherein M is a positive integer smaller than N; and
   a comparator, coupled to said DAC and said N memory units, generating a comparison value according to said analog signal;
   wherein, said M control values of said M memory units change in correspondence to said comparison value.

2. The SAR ADC of claim 1, wherein, said write control unit outputs said write-enable signal to said N memory units before said comparator generates said comparison value.

3. The SAR ADC of claim 1, wherein said write-enable signal is a first write-enable signal, said write control unit further generates a second write-enable signal, and said comparison value is a first comparison value, said comparator further generates a second comparison value, said first and second comparison values are successive outputs of said comparator, said write control unit outputs said first write-enable signal before said first comparison value is generated and outputs said second write-enable signal after said first comparison value is generated and before said second comparison value is generated.

4. The SAR ADC of claim 1 operating according to a clock to convert an analog input signal to a digital signal, wherein, said DAC receives said analog input signal to generate said analog signal at a first level of a cycle of said clock, said comparator generates said comparison value according to said analog signal at a second level of said cycle, said second level is different from said first level, and said write control unit determines said write-enable signal at said first level and outputs said write-enable signal at said second level.

5. The SAR ADC of claim 4, wherein, said cycle is a first cycle, said write-enable signal is a first write-enable signal, said write control unit further generates a second write-enable signal in a second cycle of said clock, said second cycle immediately follows said first cycle, and K of said N memory units and K capacitors corresponding to said K memory units are selected according to said second write-enable signal, K is equal to M, and said K capacitors are not exactly equal to said M capacitors.

6. A successive approximation register (SAR) analog-to-digital converter (ADC), comprising:
   a comparator, generating a comparison value according to an analog signal;
   a SAR, coupled to said comparator, comprising N memory units, each memory unit storing a control value, said N control values being associated with said comparison value, N being an integer greater than two;
   a thermometer-coded digital-to-analog converter (DAC), coupled to said comparator and said SAR, generating said analog signal and comprising N capacitors, wherein said N capacitors are respectively coupled to said N memory units, and N terminal voltages of said N capacitors are respectively controlled by said N control values; and a write control unit, coupled to said N memory units, generating a write-enable signal, wherein, M of said N memory units and M capacitors corresponding to said M memory units are selected according to said write-enable signal, and M is a positive integer smaller than N.

7. The SAR ADC of claim 6, wherein, said write control unit outputs said write-enable signal to said N memory units before said comparator generates said comparison value to cause said M control values of said M memory units to change in correspondence with said comparison value.

8. The SAR ADC of claim 6, wherein said write-enable signal is a first write-enable signal, said write control unit further generate a second write-enable signal, and said comparison value is a first comparison value, said comparator further generate a second comparison value, said first and second comparison values are successive outputs of said comparator, and said write control unit outputs said first write-enable signal before said first comparison value is generated and outputs said second write-enable signal after said first comparison value is generated and before said second comparison value is generated.

9. The SAR ADC of claim 6 operating according to a clock to convert an analog input signal to a digital signal, wherein, said thermometer-coded DAC receives said analog input signal to generate said analog signal at a first level of a cycle of said clock, said comparator generates said comparison value according to said analog signal at a second level of said cycle, said second level is different from said first level, and said write control unit determines said write-enable signal at said first level and outputs said write-enable signal at said second level.

10. The SAR ADC of claim 9, wherein, said cycle is a first cycle, said write-enable signal is a first write-enable signal, said write control unit further generates a second write-enable signal in a second cycle of said clock, said second cycle immediately follows said first cycle, and K of said N memory units and K capacitors corresponding to said K memory units are selected according to said second write-enable signal, K is equal to M, and said K capacitors are not exactly equal to said M capacitors.

11. A method for converting an analog signal to a digital signal, said method being applied to a successive approximation register (SAR) analog-to-digital converter (ADC), said SAR ADC operating according to a clock and comprising a digital-to-analog converter (DAC) and a SAR, said DAC comprising N capacitors whose capacitance values are substantially the same, N being an integer greater than two, said SAR comprising N memory units, said N memory units being respectively coupled to said N capacitors, each memory unit storing a control value, N terminal voltages of said N capacitors being respectively controlled by said N control values, said method comprising:

sampling an analog input signal to generate an intermediate analog signal at a first level of a cycle of said clock;

determining a write-enable signal in said cycle;

selecting M of said N memory units and M capacitors corresponding to said M memory units according to said write-enable signal, M being a positive integer smaller than N;

generating a comparison value according to said intermediate analog signal at a second level of said cycle, said second level being different from said first level; and changing said M control values of said M memory units according to said comparison value at said second level of said cycle.

12. The method of claim 11, wherein, said write-enable signal is inputted to said N memory units during said second level of said cycle and before said comparison value is generated to cause said M memory units of said N memory units to be writable before said comparison value is generated.

13. The method of claim 11, wherein, said step of determining said write-enable signal is completed during said first level of said cycle.

14. The method of claim 11, wherein said cycle is a first cycle, said write-enable signal is a first write-enable signal, said method further comprises:

generating a second write-enable signal at a second cycle of said clock, said second cycle immediately following said first cycle; and selecting K of said N memory units and K capacitors corresponding to said K memory units according to said second write-enable signal, K being a positive integer smaller than N;

wherein, K is equal to M, and said K capacitors are not exactly equal to said M capacitors.

* * * * *